(12) United States Patent
Xu et al.

(10) Patent No.: US 9,823,499 B2
(45) Date of Patent: Nov. 21, 2017

(54) PATTERNED POLY SILICON STRUCTURE AS TOP ELECTRIC CONTACT TO MOS-TYPE OPTICAL MODULATORS

(71) Applicant: Futurewei Technologies, Inc., Plano, TX (US)

(72) Inventors: Qianfan Xu, San Jose, CA (US); Xiao Shen, San Bruno, CA (US); Hongmin Chen, Davis, CA (US)

(73) Assignee: Futurewei Technologies, Inc., Plano, TX (US)

(*) Notice: Subject to any disclaimer, the term of this patent is extended or adjusted under 35 U.S.C. 154(b) by 0 days.

(21) Appl. No.: 15/336,489

(22) Filed: Oct. 27, 2016

(65) Prior Publication Data

US 2017/0045761 A1 Feb. 16, 2017

Related U.S. Application Data

(62) Division of application No. 14/071,327, filed on Nov. 4, 2013, now Pat. No. 9,507,180.

(51) Int. Cl.
*G02F 1/025* (2006.01)
*H01L 29/66* (2006.01)
*H01L 29/94* (2006.01)

(52) U.S. Cl.
CPC ........ *G02F 1/025* (2013.01); *H01L 29/66181* (2013.01); *H01L 29/94* (2013.01); *G02F 2202/104* (2013.01); *G02F 2202/105* (2013.01)

(58) Field of Classification Search
None
See application file for complete search history.

(56) References Cited

U.S. PATENT DOCUMENTS 9,002,144 B2 * 4/2015 Fujikata ............... G02F 1/025
385/132

2003/0015737 A1 1/2003 Nikonov et al.
(Continued)

FOREIGN PATENT DOCUMENTS

DE 102004007251 A1 9/2005

OTHER PUBLICATIONS

Fujikata, et al., "High Speed and Highly Efficient Si Optical Modulator with MOS Junction for 1.55 μm and 1.3 μm Wavelengths," Group IV Photonics (GFP) IEEE 10th International Conference, Aug. 28-30, 2013, pp. 65-66.
Liao, et al., "High speed silicon Mach-Zehnder modulator," 2005 Optical Society of America, Apr. 18, 2005, 7 pages.
(Continued)

*Primary Examiner* — Ali Naraghi
(74) *Attorney, Agent, or Firm* — Conley Rose, P.C.

(57) ABSTRACT

A metal-oxide-semiconductor (MOS) type semiconductor device, comprising a silicon substrate, a first cathode electrode and a second cathode electrode coupled to the silicon substrate and located on distal ends of the silicon substrate, a poly-silicon (Poly-Si) gate proximally located above the silicon substrate and between the first cathode electrode and the second cathode electrode, wherein the Poly-Si gate comprises a first post extending orthogonally relative to the silicon substrate comprising a first doped silicon slab, a second post extending orthogonally relative to the silicon substrate comprising a second doped silicon slab, wherein the second post is positioned so as to create a width between the first post and the second post, an anode electrode coupled to the first post and the second post and extending laterally from the first post to the second post, and a dielectric layer disposed between the first silicon substrate and the second silicon substrate.

13 Claims, 5 Drawing Sheets

(56) References Cited

U.S. PATENT DOCUMENTS

| | | | |
|---|---|---|---|
| 2004/0208454 A1 | 10/2004 | Montgomery et al. | |
| 2004/0264828 A1 | 12/2004 | Liu | |
| 2006/0125753 A1 | 6/2006 | Richards | |
| 2010/0215309 A1 | 8/2010 | Shubin | |
| 2011/0176762 A1* | 7/2011 | Fujikata | G02F 1/025 385/2 |

OTHER PUBLICATIONS

Van Campenhout, et al., "Low-Voltage, Low-Loss, Multi-Gb/s Silicon Micro-Ring Modulator based on a MOS capacitor," OFC/NFOEC Technical Digest, Jan. 23, 2012, 3 pages.

Webster, et al., "Silicon Photonic Modulator based on a MOS-Capacitor and a CMOS Driver," Compound Semiconductor Integrated Circuit Symposium (CSICs), Oct. 19-22, 2014, 4 pages.

Partial English Translation and Abstract of German Patent Application No. DE102004007251, Jul. 9, 2015, 31 pages.

Foreign Communication From a Counterpart Application, PCT Application No. PCT/CN2014/089546, International Search Report dated Feb. 11, 2015, 7 pages.

Foreign Communication From a Counterpart Application, PCT Application No. PCT/CN2014/089546, Written Opinion dated Feb. 11, 2015, 5 pages.

Office Action dated Apr. 9, 2015, U.S. Appl. No. 14/071,327, filed Nov. 4, 2013—7 pages.

Office Action dated Sep. 17, 2015, U.S. Appl. No. 14/071,327, filed Nov. 4, 2013—17 pages.

Notice of Allowance dated Sep. 22, 2016, U.S. Appl. No. 14/071,327, filed Nov. 4, 2013—8 pages.

* cited by examiner

PATTERNED POLY SILICON STRUCTURE AS TOP ELECTRIC CONTACT TO MOS-TYPE OPTICAL MODULATORS

CROSS-REFERENCE TO RELATED APPLICATIONS

This application is a divisional application of U.S. patent application Ser. No. 14/071,327 filed on Nov. 4, 2013 by Qianfan Xu, et al., and titled "Patterned Poly Silicon Structure as Top Electric Contact to MOS-Type Optical Modulators," which is incorporated by reference.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Metal-oxide-semiconductor (MOS) capacitors with polysilicon (Poly-Si) gates have been used to make efficient Electro-optical (EO) modulators on silicon. Such modulators may utilize the refractive index of the silicon occurring via the free carrier plasma dispersion effect to accomplish modulation. For example, through doping, a free carrier density change may cause optical phase modulation on the light passing through the waveguide. As used herein, the term doping may mean the injection or depletion of electrons and holes into a silicon optical waveguide. However, the performance of such devices has historically been limited by the fundamental trade-off between optical loss and increased resistivity, which may limit the operation speed through the resistor-capacitor (RC) circuit time delay ($\tau$). In this type of optical modulator, the MOS capacitor may be placed close to the center of an optical waveguide, and the optical waveguide may be part of the electric path to the capacitor. To obtain a low series resistance and thus a high EO bandwidth, the waveguide may need to be doped at a relatively high level. However, the free carriers introduced by doping create optical loss in the waveguide, and consequently low doping may be desired to achieve low optical loss. Similar tradeoff also presents in the PN-junction-based EO modulators.

SUMMARY

In one embodiment, the disclosure includes a MOS type semiconductor device, comprising a silicon substrate, a first cathode electrode and a second cathode electrode coupled to the silicon substrate and located on distal ends of the silicon substrate, a Poly-Si gate proximally located above the silicon substrate and between the first cathode electrode and the second cathode electrode, wherein the Poly-Si gate comprises a first post extending orthogonally relative to the silicon substrate comprising a first doped silicon slab, a second post extending orthogonally relative to the silicon substrate comprising a second doped silicon slab, wherein the second post is positioned so as to create a width between the first post and the second post, an anode electrode coupled to the first post and the second post and extending laterally from the first post to the second post, and a dielectric layer disposed between the first silicon substrate and the second silicon substrate.

In another embodiment, the disclosure includes a method for fabrication of a MOS type semiconductor device, comprising coupling a first cathode electrode and a second cathode electrode to distal ends of a silicon substrate, proximally locating a Poly-Si gate above the silicon substrate and between the first cathode electrode and the second cathode electrode, wherein the Poly-Si gate comprises, a first post extending orthogonally relative to the silicon substrate comprising a first doped silicon slab, a second post extending orthogonally relative to the silicon substrate comprising a second doped silicon slab, wherein the second post is positioned so as to create a width between the first post and the second post, an anode electrode coupled to the first post and the second post and extending laterally from the first post to the second post, and disposing a dielectric layer between the first silicon substrate and the second silicon substrate.

In yet another embodiment, the disclosure includes a MOS type EO modulator, comprising a silicon substrate comprising a first n-type slab and a second n-type slab located on opposing sides of the silicon substrate, a first cathode electrode coupled to the first n-type slab, a second cathode electrode coupled to the second n-type slab, a Poly-Si gate proximally located above the silicon substrate and between the first cathode electrode and the second cathode electrode, a gate oxide layer disposed between the first silicon substrate and the second silicon substrate, a first post extending orthogonally relative to the silicon substrate comprising a first p-type silicon slab, a second post extending orthogonally relative to the silicon substrate comprising a second doped silicon slab, wherein the second post is positioned so as to create a width between the first post and the second post, and an anode electrode coupled to the first post and the second post and extending laterally from the first post to the second post.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
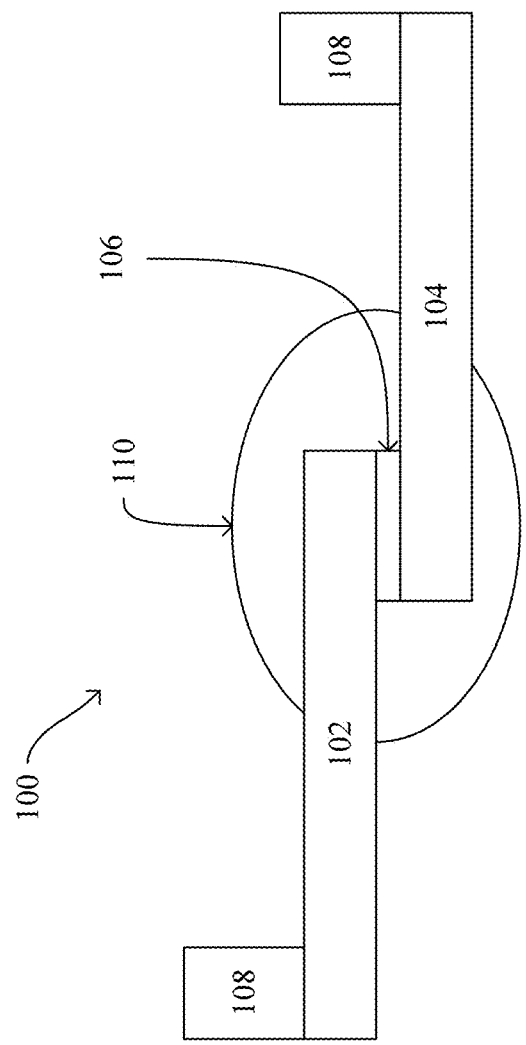
FIG. 1 is a cross-section view of a conventional MOS EO modulator.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A figure-of-merit (FOM) may include some of the important EO modulator performance factors and may be calculated as follows:

$$F = \text{EO\_Bandwidth}/((V\pi^2 C) \times \text{Optical\_Loss})$$

wherein F is the FOM, $V\pi$ is the voltage required for $\pi$ phase shift, C is capacitance, and $V\pi^2 C$ is proportional to the energy consumption per bit. As used herein, the term EO modulator may mean a device or apparatus to modulate the intensity of a beam of light and may include semiconductor devices, including MOS devices. A higher FOM may indicate a better modulator design. The EO bandwidth of the EO modulator may depend on the length of the EO modulator (e.g., due to the walk-off between the radio frequency (RF) and the optical signals) and the operation points of the interferometer or resonator that converts optical phase shift to amplitude modulation. For a typical MOS modulator with a length about 0.5 millimeters (mm) that operates at the linear region of a Mach-Zehnder interferometer (MZI), the EO bandwidth may be dominated by the RC bandwidth of the MOS capacitor, which may be obtained from a time-domain simulation of the charge dynamics in the device. If the doping level in the waveguide area of a modulator (e.g., a MOS or PN-junction based modulator) is relatively constant, the RC bandwidth and the optical loss may increase nearly linearly with the doping level. Thus, the FOM may be roughly independent of the doping level, the capacitance density, and/or the length of the EO modulator. As will be understood by those of skill in the art, the waveguide comprising the MOS structure is only part of the modulator, and may provide phase modulation. As will be understood by those of skill in the art, one or more additional components, e.g., an interferometer (such as an MZI) or a resonator (such as a ring resonator) may be utilized to some embodiments to convert phase modulation to amplitude modulation.

To improve the FOM, a wide and short electric path from the center of the waveguide, where the MOS capacitor resides, to the metal electrodes may be employed to lower the series resistance. At the same time, the optical mode may need to decay to a sufficiently low level before the electric path reaches the metal wire, otherwise a very high optical loss from the metal absorption may occur. Historic MOS modulators have the metal electrodes laterally shifted to the sides to avoid the optical loss from the metal. The silicon slab that connects the center waveguide to the side electrodes may thus need to be very thin and relatively long, which may limit the FOM of the EO modulator. Under the same doping density, the lateral connection will have a higher series resistance, which reduces the modulation bandwidth.

The disclosed approach may make the electrical connection from the vertical direction where the optical mode is more confined in order to shorten and widen the electric path from the metal electrodes. In other words, this disclosure comprises a way to connect one electrode of the MOS modulator directly from the top through a patterned and doped Poly-Si structure. Such structures may improve the FOM defined above by around a factor of two compared to conventional lateral connection schemes using equivalent doping levels. This may also be true for the transverse electric (TE) mode, as it may be easier for the TE mode to extend into a thin slab in contrast to a narrow and tall structure, thus the slab for lateral connection may need to be relatively thin to provide better confinement. Additionally, disclosed embodiments of the Poly-Si structure may be patterned with a sub-wavelength dimension so that they may be viewed optically as a medium with a lower effective refractive index than that of silicon. Thus, disclosed embodiments of the structure may act as the top cladding for the silicon waveguide underneath. At the same time, the structure may provide the electric contact to the underlying MOS capacitor junction. The wider, shorter vertical silicon trace relative to the horizontal trace for typical waveguide designs may reduce the serial resistance at a first side of the MOS capacitor by more than a factor of two using the same doping level. The second side of the MOS capacitor may still be connected horizontally with electrodes that are laterally shifted from the center of the waveguide. Using one or more embodiments disclosed herein, the connection may be made from both sides of the MOS modulator without interfering with the first electrode. Thus, the serial resistance at the second side may also be reduced by a factor of two when other factors are the same.

FIG. 1 is a cross-section view of a conventional MOS modulator 100. Modulator 100 comprises a doped silicon layer 102 (e.g., an n-type Poly-Si "gate" layer) disposed in an overlapped arrangement with an oppositely-doped portion of a p-type silicon surface layer 104. Surface layer 104 may be a surface layer of a conventional modulator structure comprising a silicon substrate and a buried oxide layer (not depicted). A thin-film dielectric (e.g., silicon dioxide, silicon nitride, etc.) layer 106 may be disposed within the overlapped region between the surface layer 104 and the doped silicon layer 102. The silicon layer 102 and the surface layer 104 may comprise electrodes 108 at which a voltage may be applied to the EO modulator 100. Upon application of a voltage, free carriers may accumulate and deplete on either side of the dielectric layer 106 as a function of the voltages applied to silicon-on-insulator (SOI) layer 3 (V3) and/or doped silicon layer 2 (V2). The modulation of the free carrier concentration results in changing the effective refractive index in the active region, thus introducing phase modulation of an optical signal 110 propagating along a waveguide defined by the active region (e.g., the optical signal 110 propagating along the y-axis, in the direction perpendicular to the paper). As will be understood by those of skill in the art, a high-k dielectric material may be used to replace the gate oxide. In such cases, the thickness of the dielectric layer may be enlarged. As used herein, the phrase "high-k" may mean a dielectric material having a dielectric constant, k, of at least about 55. As will be understood by those of skill in the art, the doping may be reversed within the scope of this disclosure, e.g., p-type doping (anode) in the lower silicon slab and n-type doping (cathode) in the Poly-Si gate.

Figure 2:
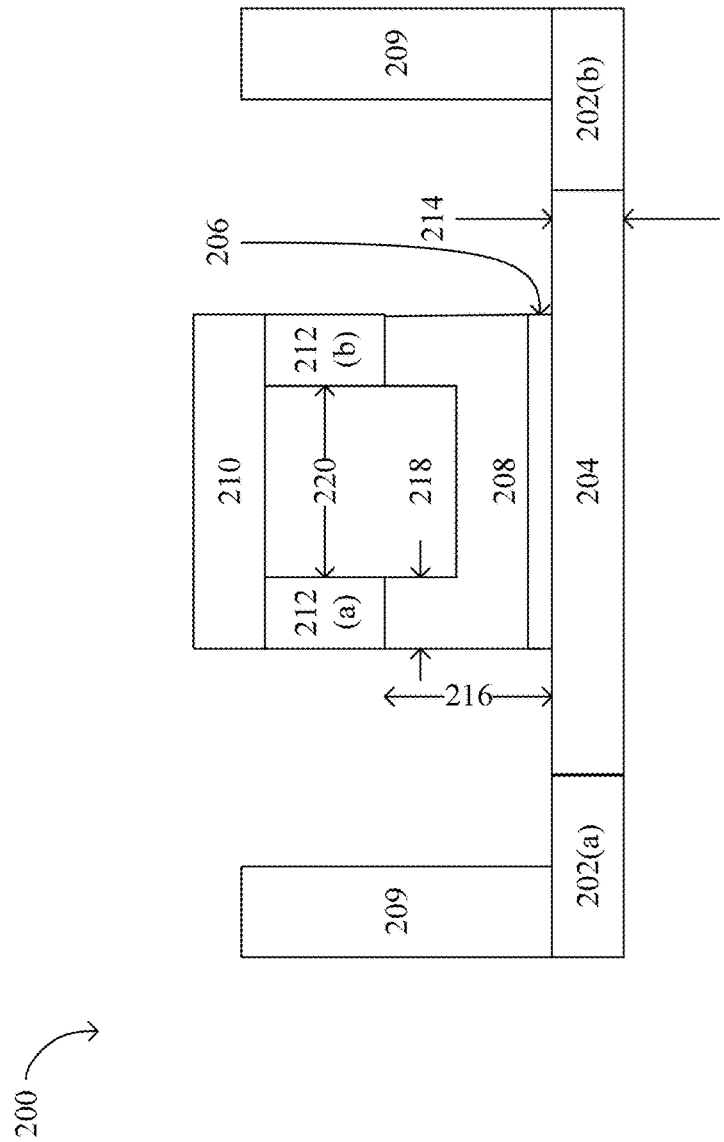
FIG. 2 is a cross-section view of an embodiment of a top-contact EO modulator.

FIG. 2 is a cross-section view of an embodiment of a top-contact modulator 200. Except as otherwise specified, the components of modulator 200 may be substantially similar to the corresponding components of modulator 100 of FIG. 1. Modulator 200 comprises a doped silicon slab 202(a) disposed on a proximate and a doped silicon slab 202(b) disposed on a distal end of an n-type silicon substrate or slab 204, a dielectric layer 206 disposed within an overlapping region between slab 204 and a p-type Poly-Si slab 208, and a p-type Poly-Si posts 212(a) and 212(b). Modulator 200 further comprises three metal electrodes, cathode electrodes 209 and anode electrode 210. The cathode electrodes 209 may be orthogonally (generally vertically) disposed on the doped silicon slabs 202(a) and 202(b), and the anode electrode 210 may extended laterally above the posts 212(a) and 212(b). The doped silicon slabs 202(a) and 202(b) and/or slab 204 may have a thickness 214, e.g., from about 20-250 nanometers (nm), about 120-140 nm, or about 120 nm. The top Poly-Si gate 218, comprising slab 208 and posts 212(a) and 212(b), may have a thickness 216, e.g., from about 00 nm and about 1 micrometer (μm), from about 700 nm and about 1 μm, or greater than about 1 μm. Poly-Si gate thicknesses greater than about 1 μm may experience diminishing returns. The top Poly-Si gate may be patterned to form multiple narrow posts, e.g., the two posts comprising slab 208 and post 212(a) on the one hand and slab 208 and post 212(b) on the other in the illustrated embodiment or multiple posts in separate embodiments (e.g., having a generally triangular, having a generally square arrangement, having a generally pentagonal arrangement, etc.), having a thickness of, e.g., about 150 to about 250 nm, or about 200 nm. The width 220 between the posts 212(a) and 212(b) may be, e.g., from about 100-300 nm. The combined thickness of the width of posts 212(a) and 212(b) may be less than about 600 nm. The combined post width limit of about 600 nm may apply to embodiments using more than two posts.

The Poly-Si gate may be patterned with a sub-wavelength dimension so that it may be viewed optically as a medium with a lower effective refractive index than that of silicon. Thus, the Poly-Si gate may act as the top cladding for the silicon waveguide underneath, while at the same time providing electric contact to the MOS capacitor junction below. As the vertical silicon trace may be wider and shorter than the horizontal silicon trace for historic waveguide designs, the serial resistance may be reduced by a factor of two when other factors remain constant. As would be understood by those of skill in the art, modulator 200 may be alternately constructed to comprise three or more posts within the scope of this disclosure. Narrow post widths may avoid the optical mode extending vertically. A partial etch may be used to pattern the central part of the Poly-Si slab 208, leaving a thickness 216 that is about the same as thickness 214. This may ensure that the MOS capacitor is spatially configured to remain close to the center of the optical mode. To obtain relatively large capacitance per unit waveguide length, the EO modulator 200 may be relatively short (e.g., a few hundred μm) and the gate oxide thickness between slab 208 and the posts 212(a) and 212(b) may be from 1-10 nm thick. Alternatively, a high-k dielectric material may be used to replace the gate oxide. In such embodiments, the thickness of the dielectric layer may be enlarged. The construction described above (including alternate embodiments) permits the EO modulator 200 to be connected horizontally and/or externally from both sides, e.g., using orthogonally disposed cathode electrodes 209 laterally shifted from the center of the waveguide, without interfering with the laterally disposed anode electrode 210.

Figure 3:
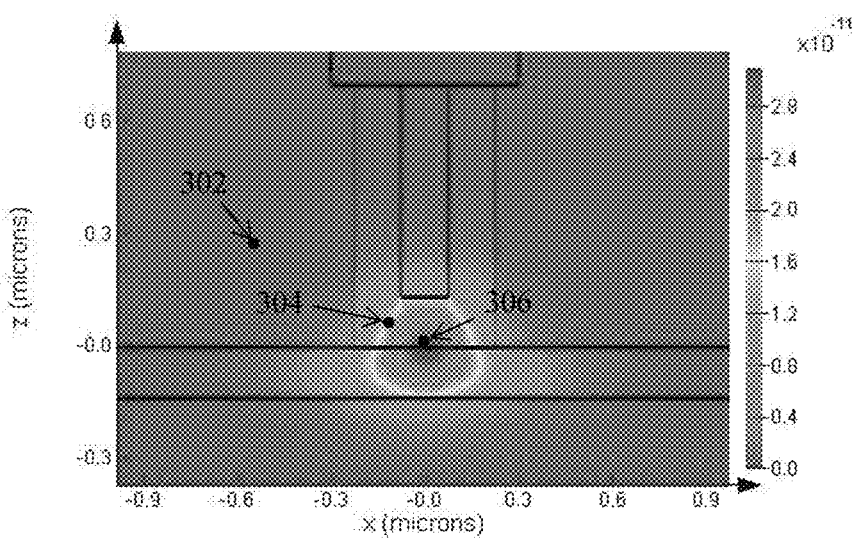
FIG. 3 is a chart of a cross-sectional optical intensity distribution of the fundamental TE mode for an embodiment of a disclosed EO modulator.

FIG. 3 is a chart of a cross-sectional optical intensity distribution of the fundamental TE mode at the wavelength of 1550 nm for an embodiment of a disclosed modulator, e.g., modulator 200 of FIG. 2. Height (z) and length (x) are shown in nm and wavelength is depicted by shading intensity variance in $\mu m^2$/milliwatts (mW). The embodiment used to obtain the results comprised an n-type silicon slab, e.g., n-type silicon slabs 202(a) and 202(b) of FIG. 2, having a thickness of 140 nm, a gate oxide layer, e.g., dielectric layer 206 of FIG. 2, having a thickness of 5 nm, a Poly-Si slab, e.g., slab 204 of FIG. 2, having a thickness of 120 nm and a width of 450 nm, and a Poly-Si posts, e.g., posts 212(a) and 212(b) of FIG. 2, having a width of 150 nm and a height of 580 nm, with a width of 150 nm between the posts. The n-type silicon slab may be doped from about $1 \times 10^{17}$ cm$^{-3}$ to about $1 \times 10^{19}$ cm$^{-3}$, e.g., at $8 \times 10^{17}$ cm$^{-3}$, and the Poly-Si p-type slab may be doped from about $1 \times 10^{17}$ cm$^{-3}$ to about $1 \times 10^{19}$ cm$^{-3}$, e.g., at $8 \times 10^{17}$ cm$^{-3}$. At the distance 500 μm from the center, the optical mode (e.g., the fundamental TE mode) may be generally confined and the intensity in the metal region may be comparatively low. Consequently, the optical mode is more confined and the electric path from the metal electrodes is shortened and widened. For example, at 302, the optical intensity may be near 0 $\mu m^2$/mW. At 304, the optical intensity may be about $1.8 \times 10^{-11}$ $\mu m^2$/mW, and at 306 the wavelength may be above $2.8 \times 10^{-11}$ $\mu m^2$/mW. Thus, using disclosed embodiments, the optical mode may be generally confined between the Poly-Si posts.

In alternate embodiments, the top Poly-Si slab may be patterned in the longitudinal (wave propagation) direction. This type of patterning may have a similar effect in reducing the effective index of that layer, permitting function as the upper cladding. To avoid reflection, the period of the pattern may be smaller than $\lambda/2n_{eff}$, where $\lambda$ is the wavelength and $n_{eff}$ is the effective index of the mode in the waveguide. In some embodiments, the wavelength is from about 1.1 to about 1.7 mm. Patterning in the transverse direction (as described herein) and in the longitudinal direction may optionally be combined to allow further reduction of the effective index.

FIGS. 4-7 show the result of time-domain simulation of the free-carrier density inside the waveguide region of an embodiment of the disclosed modulator, e.g., modulator 200 of FIG. 2 having the characteristics described in FIG. 3.

Figure 4:
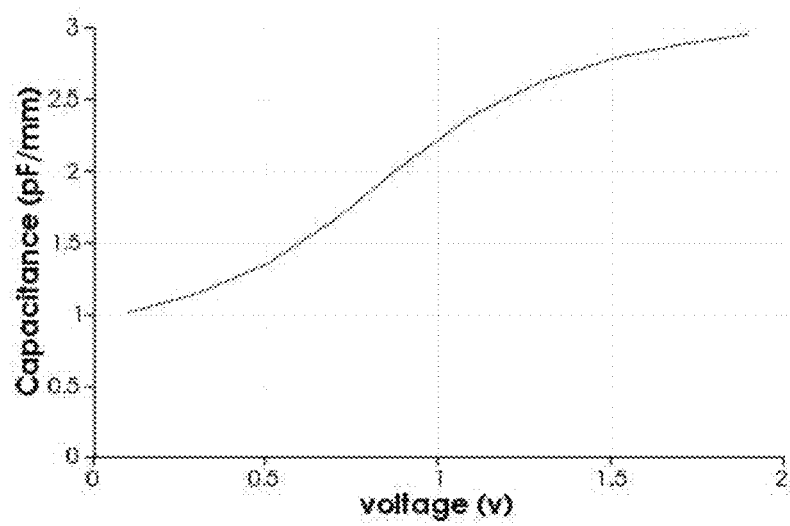
FIG. 4 is a chart of the simulated capacitance per applied voltage for the embodiment of the EO modulator.

FIG. 4 is a chart of the simulated capacitance per applied voltage for the embodiment of the EO modulator used in FIG. 3. In FIG. 4, capacitance per unit length is measured in picofarads (pF) per (pF/mm) and applied voltage is measured in volts (V). As shown, the EO modulator displays a comparatively high capacitance density with respect to contemporary modulators when the voltage applied on the MOS capacitor is changed from about 0.95 V to about 1.05 V.

Figure 5:
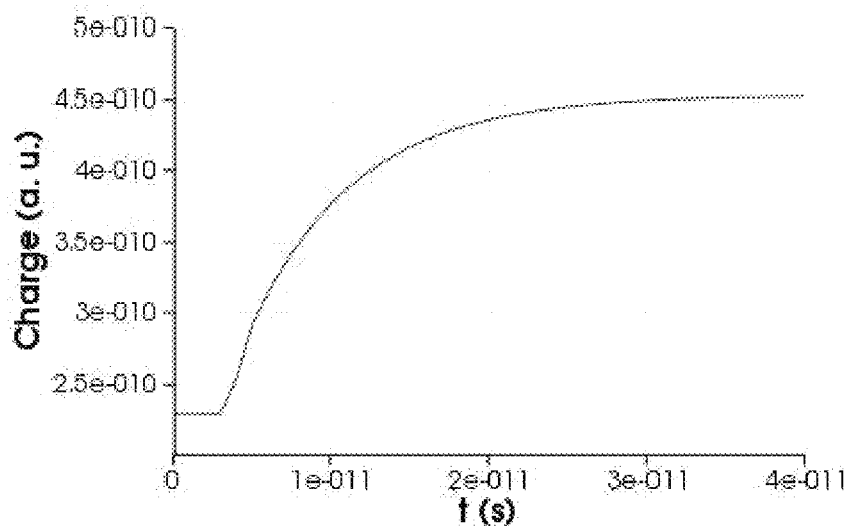
FIG. 5 is a chart of the simulated charge per unit time for the embodiment of the EO modulator.

FIG. 5 is a chart of the simulated charge per unit time for the embodiment of the EO modulator used in FIG. 3. In FIG. 5, charge is measured in arbitrary units (a.u.) and time (t) is measured in seconds (s). The RC time constant of the EO modulator is calculated to be τ=RC about equal to about 6.3 picoseconds (ps) or less, corresponding to a 3 decibel (dB) RC bandwidth of $1/(2\pi RC)$ about equal to about 25 gigahertz (GHz). This may be sufficiently high for about 25 gigabits per second (Gbps) or about 28 Gbps modulations, and consequently disclosed embodiments may be used to build 25 Gbps modulators with about 1V peak-to-peak driving voltage, about 6 dB extinction ratio (ER) and less than about 4 dB insertion loss, e.g., <2.5 dB insertion loss.

In FIGS. 4 and 5, at the waveguide region of the EO modulator embodiment, the silicon slab may be doped n-type at about $8 \times 10^{17}$ cm$^{-3}$, and the poly-Si region may be doped p-type at about $8 \times 10^{17}$ cm$^{-3}$. At the distance about 500 μm from the center, the doping level in the silicon slab gradually increases to about $1 \times 10^{20}$ cm$^{-3}$ (following an error function) to make Ohmic contact with the side electrodes. In the vertical direction, the doping level starts to increase at a distance about 200 µm from the gate oxide until reaching about $1\times10^{20}$ cm$^{-3}$ at the poly-Si surface to make Ohmic contact with the top electrode.

Figure 6:
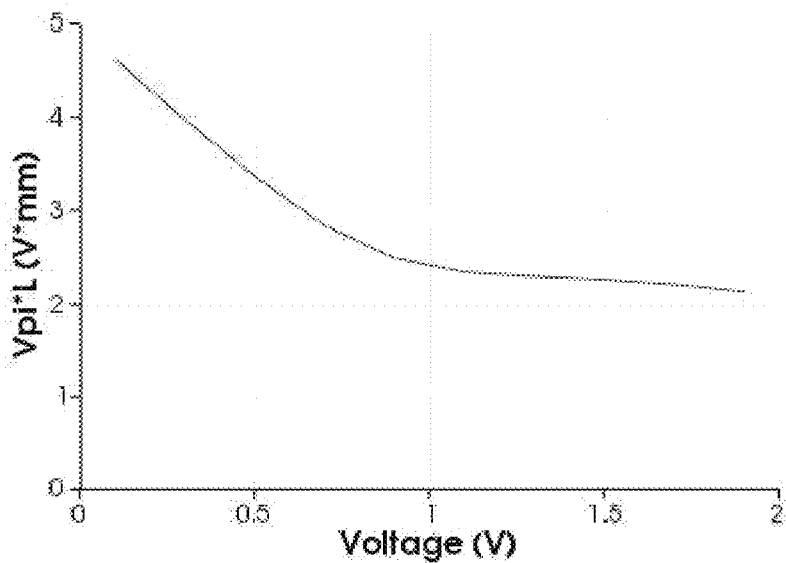
FIG. 6 is a chart of the simulated electrical characteristics to achieve a given modulation depth for the embodiment of the EO modulator.
Figure 7:
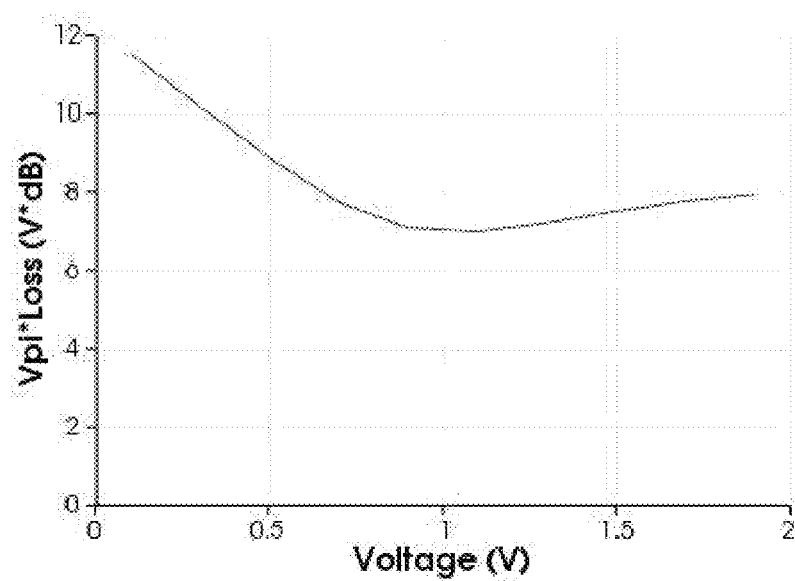
FIG. 7 is a chart of the simulated product of voltage and loss against applied voltage for the embodiment of the EO modulator.

With respect to FIGS. 6 and 7, the relationship between free carrier distribution and voltage applied between the electrodes described above may be plugged into an optical mode solver to obtain the effective indices and optical losses of the fundamental TE mode at different voltages, from which the product of voltage required for a full π phase shift ($V_\pi$) and length (L) ($V_\pi$·L) and the product of $V_\pi$ and Loss ($V_\pi$·Loss) may be calculated for the embodiment of the EO modulator used in FIG. 3. FIG. 6 is a chart of the simulated $V_\pi$·L against applied voltage (V) to achieve a given modulation depth for the embodiment of the EO modulator used in FIG. 3. FIG. 7 is a chart of the simulated product of voltage and loss against applied voltage for the embodiment of the EO modulator used in FIG. 3. FIGS. 6 and 7 do not consider the propagation loss of passive waveguide (undoped). At the bias voltage of about 1 V, $V_\pi$·Loss=about 7 dB·V and $V_\pi$·Capacitance (C)=about 5.2 pF·V. Thus the FOM F=about 0.7 GHz/picoJoules (pJ)·dB. A MZI with MOS capacitor on both arms may be used to translate this number to device performance. To obtain a about 6-dB dynamic extinction ratio (ER) at about 25 gigabits per second (Gbps), a phase shift of about 0.25π on each arm and an EO bandwidth of >20 GHz is needed. If about 1 V (peak-to-peak) is applied on each arm with a direct current (DC) bias of 1 V, then the length of each MOS capacitor may be about 600 µm, and the insertion loss of the EO modulator may be about 1.9 dB (plus the passive waveguide loss, which may be much smaller than 1 dB). This insertion loss may be much smaller than those reported in the literature for historic modulator designs with similar bandwidths. One can also achieve a similar FOM by using the transverse magnetic $^{TM}$ mode in a narrow and tall waveguide having lateral electrical connections because TM tends to extend vertically instead of horizontally. However, since most other silicon photonic devices are designed for the TE mode, this approach may involve substantial loss and complex conversion between the two polarizations. Further, the narrow and tall waveguide may be harder to fabricate compared to wide and thin waveguide. Additionally, the dimensions may need to be designed carefully to avoid coupling between the TM mode and the slab TE mode in the lateral slabs.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means+/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A method of fabricating a metal-oxide-semiconductor (MOS)-type device, the method comprising:
    coupling a first cathode electrode to a proximate end of a silicon substrate comprising a first doped silicon slab and a second doped silicon slab;
    coupling a second cathode electrode to a distal end of the silicon substrate;
    proximally locating a poly-silicon (poly-si) slab above the silicon substrate and between the first cathode electrode and the second cathode electrode, wherein the poly-si slab comprises:
        a first post extending orthogonally relative to the first doped silicon slab,
        a second post extending orthogonally relative to the second doped silicon slab, wherein the second post is positioned so as to create a width between the first post and the second post, and wherein the width comprises a dielectric material, and an anode electrode coupled to the first post and the second post and extending laterally from the first post to the second post; and disposing a substantially planar rectangular dielectric layer between the silicon substrate and the poly-si slab.

2. The method of claim 1, wherein the first post and the second post have a thickness from about 150 nanometers (nm) to about 250 nm.

3. The method of claim 2, wherein the first post and the second post have a thickness of about 200 nm.

4. The method of claim 1, wherein the width is about 50 nanometers (nm) to about 300 nm, wherein the first post has a second width from about 50 nm to about 300 nm, wherein the second post has a third width from about 50 nm to about 300 nm, and wherein a combined width of all posts is less than about 600 nm.

5. The method of claim 1, wherein the first doped silicon slab and the second doped silicon slab are doped from about $1 \times 10^{17}$ inverse cubic centimeters ($cm^{-3}$) to about $1 \times 10^{19}$ $cm^{-3}$.

6. The method of claim 1, wherein the dielectric layer is a high-k dielectric material.

7. The method of claim 1, wherein the width is from about 161 nanometers to about 300 nm.

8. The method of claim 1, wherein the anode electrode is directly and physically coupled to the first post and the second post.

9. The method of claim 1, wherein the poly-si slab is configured to provide a top cladding for a waveguide and provide an electric contact to a metal-oxide-semiconductor (MOS) capacitor junction.

10. The method of claim 1, wherein the poly-si slab is longitudinally patterned with respect to a direction of wave propagation.

11. The method of claim 10, wherein a period of a pattern of the poly-si slab is smaller than $\lambda/2n_{eff}$, wherein $\lambda$ is a wavelength and $2n_{eff}$ is an effective index of a mode in a waveguide.

12. The method of claim 11, wherein the wavelength is from about 1.1 micrometers (μm) to about 1.7 μm.

13. The method of claim 1, wherein the poly-si slab is transversely patterned with respect to a direction of wave propagation.

* * * * *

UNITED STATES PATENT AND TRADEMARK OFFICE
CERTIFICATE OF CORRECTION

| | | |
|---|---|---|
| PATENT NO. | : 9,823,499 B2 | |
| APPLICATION NO. | : 15/336489 | |
| DATED | : November 21, 2017 | |
| INVENTOR(S) | : Qianfan Xu et al. | |

It is certified that error appears in the above-identified patent and that said Letters Patent is hereby corrected as shown below:

In the Claims

Column 10, Lines 1-2, Claim 7 should read:

7. The method of claim 1, wherein the width is from about 161 nanometers (nm) to about 300 nm.

Signed and Sealed this
Twentieth Day of February, 2018

Andrei Iancu
*Director of the United States Patent and Trademark Office*